United States Patent
Flanigan et al.

(10) Patent No.: US 7,484,380 B2
(45) Date of Patent: Feb. 3, 2009

(54) DETERMINING MAXIMUM COOLING FOR A COMPONENT BY RETRIEVING AN OFFSET VALUE

(75) Inventors: Edward P. Flanigan, Burbank, SD (US); Keith C. Thomas, Vermillion, SD (US)

(73) Assignee: Gateway Inc., Irvine, CA (US)

( * ) Notice: Subject to any disclaimer, the term of this patent is extended or adjusted under 35 U.S.C. 154(b) by 450 days.

(21) Appl. No.: 11/201,882

(22) Filed: Aug. 11, 2005

(65) Prior Publication Data

US 2006/0032250 A1    Feb. 16, 2006

Related U.S. Application Data

(60) Provisional application No. 60/601,490, filed on Aug. 13, 2004.

(51) Int. Cl.
*F25D 23/12* (2006.01)
*F25D 17/04* (2006.01)
*H05K 7/20* (2006.01)

(52) U.S. Cl. ............... 62/259.2; 62/186; 236/49.3; 361/695

(58) Field of Classification Search .......... 62/259, 62/2, 186, 259.2; 236/49.3; 361/695, 696, 361/697, 690
See application file for complete search history.

(56) References Cited

U.S. PATENT DOCUMENTS

| | | | | |
|---|---|---|---|---|
| 5,348,078 A | * | 9/1994 | Dushane et al. | 165/209 |
| 6,996,441 B1 | * | 2/2006 | Tobias | 700/44 |
| 7,123,996 B2 | * | 10/2006 | Fukushima et al. | 700/299 |
| 7,249,718 B2 | * | 7/2007 | Beitelmal et al. | 236/49.3 |
| 7,290,721 B2 | * | 11/2007 | Cheng | 236/49.3 |
| 2006/0117779 A1 | * | 6/2006 | Liebenow | 62/259.2 |

* cited by examiner

*Primary Examiner*—Marc E Norman
(74) *Attorney, Agent, or Firm*—Jeffrey A. Proehl; Woods Fuller Shultz & Smith

(57) ABSTRACT

The present invention is directed to a system for determining a temperature of a component that requires a maximum level of cooling apparatus operation. The system monitors the component's temperature, then may add a compensation offset to account for variations in the manufacture of the component, and then adds a compensation offset to account for variation in the system in which the component is installed. The result is used to determine when the system's cooling apparatus needs to be operated at a maximum level of operation. The sum may be compared to a threshold to make this determination. This same mechanism may be used to determine various other cooling system trigger points, both when to increase cooling as well as decrease cooling.

22 Claims, 2 Drawing Sheets

System Block Diagram

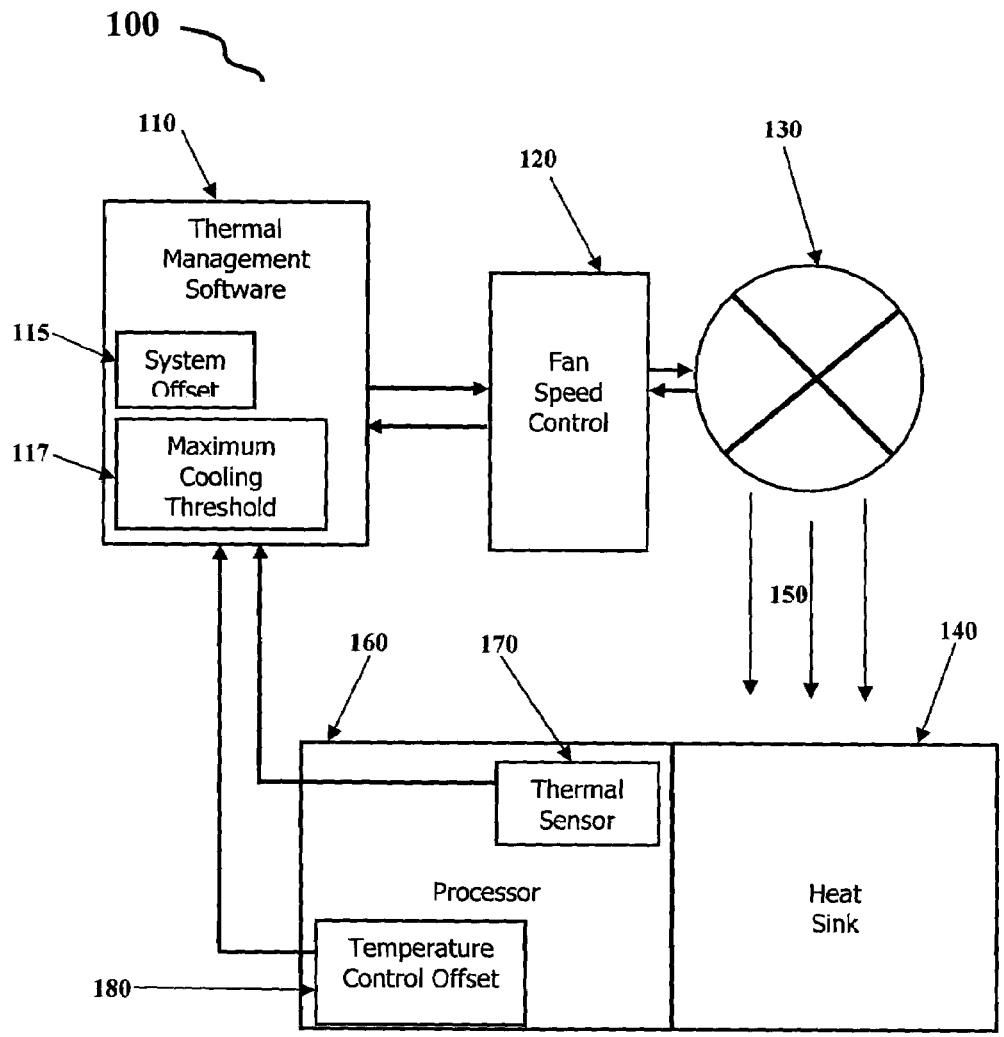
Figure 1 – System Block Diagram

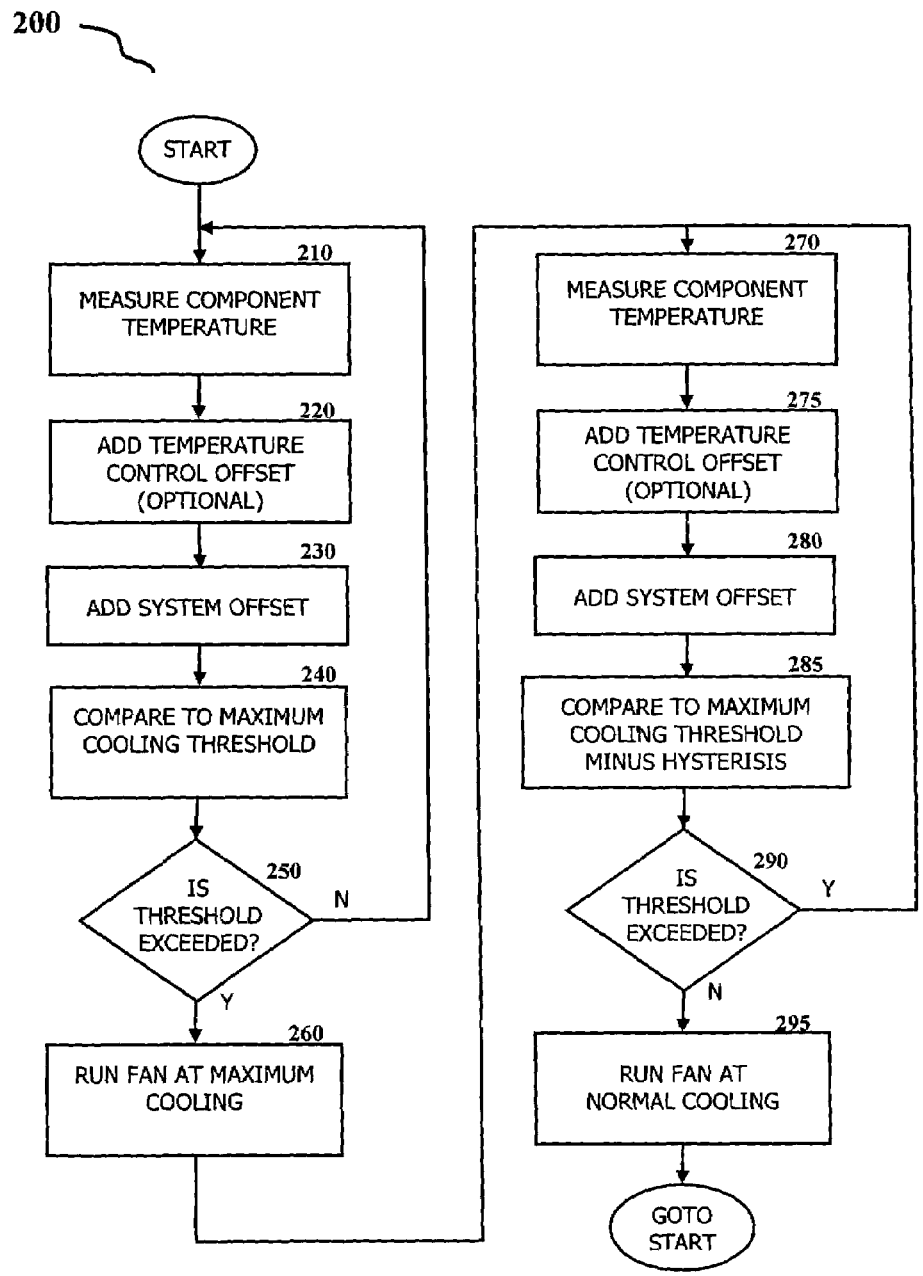
Figure 2 – System Flow Chart

DETERMINING MAXIMUM COOLING FOR A COMPONENT BY RETRIEVING AN OFFSET VALUE

REFERENCE TO RELATED APPLICATIONS

This application claims the priority of U.S. provisional patent application No. 60/601,490, filed Aug. 13, 2004, which is incorporated herein in its entirety by reference.

FIELD OF THE INVENTION

The present invention generally relates to the field of cooling apparatus for electronic devices, and particularly to a system and method for determining an optimal temperature at which maximum cooling is needed.

BACKGROUND OF THE INVENTION

Electronics devices, such as desktop computers, tower computers, servers, tablet computers, notebook computers and other similar devices utilize various methods and apparatus to reduce thermal build-up, or the accumulation of waste heat, within their chassis. These apparatus sometimes include a cooling apparatus, such as a fan, to circulate air within the chassis and/or exchange air inside the chassis with air external to the chassis to help reduce thermal build-up. However, the cooling apparatus, such as fans, can create problems of their own. These problems include, for example, noise, vibration, increased power consumption, and an increased failure rate due to the fact that these devices have moving parts.

Previously, when some electronic components of an electronic device have reached a predetermined temperature, the cooling apparatus of those devices have been set to operate at a maximum operating level or rate in order to produce the maximum cooling capacity of the apparatus. Some electronic components have integrated temperature sensors that are used to determine or sense the operating temperature of that component. Furthermore, some electronic components, such as microprocessors, also have a programmed value that is integrated into the component, and that value indicates at what temperature of the component maximum cooling is needed to be applied to component, either through a cooling apparatus dedicated to the component, or the cooling apparatus directed to cooling the overall electronic device. The component may also include an offset value to the specified temperature at which maximum cooling for the component is needed. This integrated programmed offset value, which is sometimes called the Temperature Control Offset value, may be set for the particular individual component by the manufacturer of the component during the manufacture of the component, after the value has been determined for the operational characteristics of that component. Thus, for example, one manufactured processor may have a hot spot that requires maximum operation of the cooling apparatus at one temperature of the component; while a second manufactured processor of the same type may not have that hot spot and may be operated at a higher temperature of the component before requiring maximum operation of the cooling apparatus.

This approach accounts for variations in the manufacturing process of the component, but it does not compensate or take into consideration variations in the electronic device into which the electronic component is incorporated, such as an information handling system, and these variations in the system may affect the need for cooling apparatus operation with respect to the electronic component. For example, one manufacturer of information handling systems may design a system that has relatively larger heat sinks and/or more effective or higher capacity fans, and thus the cooling apparatus of that system may be better able to cool the electronic component, and therefore, may not need to operate at a maximum cooling level until the component reaches a higher temperature. Conversely, another system manufacturer may utilize relatively smaller heat sinks and/or relatively lower capacity fans, and thus the cooling apparatus for that system may need to operate at a maximum cooling level at a relatively lower temperature of the component. Unfortunately, using the current approaches, there is no way to compensate or adjust for the enhanced cooling capacity of systems employing better designed or more capable cooling apparatus. For example, if the cooling apparatus employs a fan that produces a relatively larger than expected air flow, then the maximum operation speed of the fan may not be required when the component reaches its maximum operating temperature, and only a fraction of the maximum operation speed may be sufficient.

Therefore, it would be desirable to be able to control the cooling system in a manner that would take into account not only the individual cooling characteristics of the component, but also the individual cooling characteristics of a system, which may permit the cooling apparatus to delay maximum cooling level operation of the cooling apparatus until a higher temperature is detected in the component, thereby decreasing noise produced by the cooling apparatus, saving power consumed by the cooling apparatus, and improving the reliability and longevity of components of the cooling system.

SUMMARY OF THE INVENTION

Accordingly, the present invention is directed to determining a temperature for a component that requires a maximum level of the cooling apparatus of the system in which the component is installed. The present invention can permit the cooling apparatus of an information system to operate at less than a maximum level for longer periods of time; and thereby can reduce cooling apparatus noise during operation of the information handling system. Furthermore, the present invention can improve the reliability and longevity of the cooling apparatus of the system by reducing the amount of time during which the cooling apparatus operates at a maximum level.

In one aspect of the present invention, a method of operating a cooling apparatus for an information handling system is disclosed, and comprises determining a current temperature of a component of the information handling system, and obtaining a general characteristic maximum cooling temperature for the component type of the component of the information handling system. The method further comprises retrieving a system temperature offset value for the information handling system, combining the current temperature of the component and the system temperature offset value for the information handling system into a combined value, and comparing the combined value with a maximum cooling threshold value. Optionally, the method may include initiating the maximum level of operation for the cooling apparatus of the information handling system if the combined value is approximately equal to or greater than the maximum cooling threshold value The method may also optionally include operating the cooling apparatus of the information handling system at a level less than the maximum level of operation of the cooling apparatus if the combined value is approximately less than the maximum cooling threshold value.

In another aspect of the present invention, an information handling system is disclosed that comprises a cooling apparatus having a maximum level of operation and a level of operation less than the maximum level of operation, a component, means for determining a current temperature of a component of the information handling system, means for obtaining a general characteristic maximum cooling temperature for a component type of the component, means for retrieving a system temperature offset value for the information handling system, means for combining the current temperature of the component and the system temperature offset value for the information handling system into a combined value, and means for comparing the combined value with a maximum cooling threshold value.

In another aspect of the present invention, It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description serve to explain the principles of the invention.

BRIEF DESCRIPTION OF THE DRAWINGS

The numerous advantages of the present invention may be better understood by those skilled in the art by reference to the accompanying figures in which:

FIG. 1 is a system block diagram of the thermal management system.

FIG. 2 is a flow chart of the thermal management software.

DETAILED DESCRIPTION OF THE INVENTION

Reference will now be made in detail to the presently preferred embodiments of the invention, examples of which are illustrated in the accompanying drawings.

Referring generally now to FIGS. 1 and 2, exemplary embodiments of the present invention are shown for determining component temperature requiring a maximum level of operation of a cooling apparatus. The cooling apparatus is illustratively employed on an information handling system, although other applications of the invention are possible.

Referring to FIG. 1, a system block diagram of a system for determining component temperature requiring maximum cooling system operation is shown. In the illustrative system, thermal management software 110 controls the operation of the cooling apparatus. Although the thermal management control may not require run time software control, it may need some initialization on the system. In the illustrative embodiment, the cooling apparatus includes a fan 130 that is controlled by a fan speed control 120. While the cooling apparatus is described as including a fan, it is foreseeable that the invention may be employed on cooling apparatus employing other cooling devices.

The fan of the cooling apparatus may be employed, for example, on a heat sink that is associated with the component, although it is possible that the fan may be located relatively remotely with respect to the component, such as, for example, on a wall of a case of the information system or on a power supply unit of the system. The heat sink may be thermally coupled to the component, and the component may produce heat. The fan 130 thus may be coupled to the heat sink 140 such that the fan creates an air movement 150 over the fins of the heat sink when the operation of the fan 130 is produced by the fan speed control 120. As the rotation of the fan 130 increases in speed, the fan forces a greater volume of air over the heat sink 140, thereby providing a higher level of cooling. Unfortunately, with an increase in the rotational speed of the fan, the power consumed by the fan increases, as well as the noise produced by the fan. The reliability of the fan 130 can also be negatively affected, and the longevity or life span of the fan can also be decreased.

The thermal management software 110 may monitor the operating temperature of the component. In the illustrative embodiment, the component is a microprocessor 160, although other components may be employed in the invention. The component may have a temperature sensor that is integrated into the component, and the sensor may comprise, for example, a diode or a thermistor. The temperature of the component may thus be derived by reading a signal from the temperature sensor, which may increase or decrease in magnitude as the temperature of the component increases or decreases.

Optionally, the thermal management software 110 may add a temperature control offset 180 to the measured temperature of the component to compensate for variations in the otherwise identical components, such as the processor 160 component. The temperature control offset 180 may be the offset provided by the component manufacturer to compensate for manufacturing variations in the component. In some components, the temperature control offset value is preprogrammed into the component during manufacture to indicate a threshold temperature of the component at (and above) which a maximum level of cooling of the component is required by the component.

The preprogrammed value may be tailored to the characteristics of the particular component, and thus components of the same type or model may have a different value. The preprogrammed value may be set during manufacture to compensate for and reflect differences in the manufactured lots of the components, or the pieces within lots. This variation in the preprogrammed value may reflect the capability of one component to operate at relatively higher temperatures than components of other lots or pieces. The maximum level of cooling required by the component at this temperature may be defined in a design guide provided by the manufacturer for the component. The temperature control offset 180 may be stored within the component itself, and in storage selected from a PROM, EPROM, EEPROM, FLASH, MRAM, and fusable link. The temperature control offset 180 may be read directly from the component, such as by reading a register in the processor.

To compensate for variations in the cooling of the component due to variations in the information handling system, a system offset 115 may be added to the measured temperature in addition to the temperature control offset 180, which results in a modified measured temperature of the component. The system offset 115 provides a way for the manufacturer of the overall information handling system to compensate for variations in, for example, different models of information handling systems in the manufacturer's product line. Most significantly, the manufacturer may compensate or adjust for differences in cooling characteristics or capabilities in different systems and chassis, which may be affected, for example, by the number of components in the system, the positioning of the components in the chassis, the heat generating characteristics of the components in the system, impediments to air flow, positioning of the subject component in the chassis, and a multitude of other factors that influence the cooling characteristics and capabilities of a system. For example, if the component is to be integrated into a chassis or system that has relatively superior cooling characteristics, the system offset 115 may be positive, allowing the component to reach a higher temperature before initiating a maximum level of cooling apparatus operation than would otherwise be called for using the temperature control offset alone. Conversely, if the component is to be integrated into a chassis or system that has relatively inferior cooling characteristics, the system offset 115 may be negative, which may initiate a maximum level of cooling apparatus operation at a lower temperature than would otherwise be initiated using the temperature control offset alone.

Thus, the value of the system offset may be used to further offset or adjust a pre-determined temperature control offset of the component at which a maximum level of cooling apparatus operation may be initiated, or it may be an absolute temperature value at which a maximum level of cooling apparatus operation should be started. The system offset may thus be added to the temperature control offset of the component to effect maximum cooling at a different temperature than that which may have been specified by the manufacturer for the component. A positive system offset value may require maximum cooling operation at a relatively higher temperature than that specified in the component requirements, which may be as a result of the system in which the component is installed having relatively superior cooling capability or characteristics. A negative system offset value may require a maximum level of cooling apparatus operation at a relatively lower temperature than that specified in the component specifications, which may be as a result of the system in which the component is installed having relatively inferior cooling capability or characteristic, or even may be employed if a portion of the cooling apparatus is malfunctioning.

The resulting modified measured temperature may be used to determine if the cooling apparatus needs to be operated at a maximum level of operation, such as the fan 130 of the cooling apparatus operating at a maximum rotational speed. This operation may be accomplished by comparing the modified measured temperature to a threshold temperature such as a maximum cooling threshold 117, or may be accomplished through other methods. For example, when a fixed temperature is exceeded, such as 70 degrees Centigrade, a maximum level of cooling apparatus operation may be initiated. In any case, once it is determined that the fan 130 needs to be operated at maximum rotation speed, the thermal management software 110 may signal the fan speed control 120 to run the fan 130 at maximum rotational speed. Although not related to this disclosure, there might be hysteresis included in the thermal management software 110, so that as the measured temperature decreases as a result of the maximum level of cooling apparatus operation, the fan 130 may still be operated at maximum cooling speed until the measured temperature falls below the threshold or fixed temperature by more than a few degrees. Thus, a condition where the fan 130 speeds up and slows down over and over in relatively short periods of time can be mitigated.

Referring to FIG. 2, a flow chart of a process or procedure for determining the component temperature requiring a maximum operation level of a cooling apparatus is shown. Initially, the temperature of the component is measured (block 210), which may be accomplished in various ways using any of a variety of temperature sensors, including measuring the forward voltage drop over a diode or the resistance of a thermistor. The temperature sensor may be integral to the component or may be located close enough to the component to relatively accurately track the component's temperature. The measured temperature may be added to the temperature control offset (block 220). This step is optional and may be performed if the component has the capability to report or store this value, and otherwise flow continues at block 230. As noted above, the temperature control offset may be the offset value provided by the component manufacturer to compensate for variations in the manufacturing.

The system offset may be added to the measured temperature of the component and the optional temperature control offset value (block 230). The sum total of the measured temperature plus the temperature control offset value plus the system offset value is compared to a maximum cooling threshold value (block 240). The maximum cooling threshold value may be used to determine when a maximum level of operation of the cooling apparatus is needed for cooling the component. The maximum cooling threshold value may be stored, for example, in memory of the system, on a hard drive, in SRAM, or any memory available which is preferably a persistent memory. If the maximum cooling threshold is not exceeded (block 250), the steps of blocks 210 through 240 may be repeated. It is anticipated that these steps could be repeated continuously, possibly with a delay between the repeated loops or at timed intervals.

If the maximum cooling threshold is exceeded by the sum of the values of the measured temperature, temperature control offset, and the system offset (as applicable), maximum cooling is initiated (block 260), such as by energizing a fan of the cooling apparatus to operate at its maximum rotational speed (e.g., maximum RPM). To reduce the possibility of constant fluctuations in the rotational speed of the fan, a sort of hysteresis may be provided (blocks 270 through 295) so that the fan rotational speed isn't reduced after only a slight reduction in the measured temperature of the component. This form of hysteresis is well known in the art and shown here as an example of a complete system, but is not required by the present invention. The component temperature is measured (block 270), possibly in the same manner as the initial measurement (block 210). The temperature control offset is added to the measured temperature of the component (block 275), and the system offset is also added to the measured temperature and (optionally) the temperature control offset (block 280). The total of the values is compared to the maximum cooling threshold (block 285), but a hysteresis value may be subtracted from the maximum cooling threshold in order to determine when to reduce the operational level of the cooling apparatus. The manner of determining the threshold point for reducing the cooling apparatus level of operation can be any known in the industry. For example, the comparison point could be the original maximum cooling threshold minus a hysteresis value, or a second threshold value could be employed, such as a reduce cooling threshold, that may be, for example, a few degrees lower than the maximum cooling threshold for which to compare against the sum of the values. In any case, if the threshold is exceeded (block 290), then the steps of blocks 270 through 285 may be repeated until the measured temperature of the component cools sufficiently to be below the hysteresis threshold. The steps of blocks 270 through 285 could also be repeated continuously, with a delay between the repeated loops or at timed intervals. Once the sum of the values (including the measured temperature) decreases to below the hysteresis threshold, then the operational level of the cooling system may be reduced to operate at lesser or relatively normal cooling operation levels and the process may be repeated (block 210).

It is believed that the system and method of the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely exemplary and explanatory embodiment thereof. It is the intention of the following claims to encompass and include such changes.

What is claimed is:

1. A method of operating a cooling apparatus for an information handling system, comprising:
   determining by the cooling apparatus a current temperature of a component of the information handling system;
   obtaining by the cooling apparatus a general characteristic maximum cooling temperature for the component type of the component of the information handling system;
   retrieving by the cooling apparatus a system temperature offset value for the information handling system;
   combining the current temperature of the component and the system temperature offset value for the information handling system into a combined value; and
   comparing the combined value with a maximum cooling threshold value; and
   initiating a level of operation of the cooling apparatus of the information handling system based upon the comparison of the combined value with the maximum cooling threshold value;
   wherein the system temperature offset value is based upon an arrangement of components of the information handling system in a case of the information handling system.

2. The method of claim 1 wherein, if the combined value is equal to or greater than the maximum cooling threshold value, the level of operation for the cooling apparatus of the information handling system that is initiated is a maximum level of operation.

3. The method of claim 1 wherein, if the combined value is less than the maximum cooling threshold value, the level of operation of the cooling apparatus of the information handling system that is initiated is a level less than a maximum level of operation of the cooling apparatus.

4. The method of claim 1 wherein, if the combined value is equal to or greater than the maximum cooling threshold value, the level of operation for the cooling apparatus of the information handling system that is initiated is a maximum level of operation; and
   wherein, if the combined value is less than the maximum cooling threshold value, the level of operation of the cooling apparatus of the information handling system that is initiated is a level less than a maximum level of operation of the cooling apparatus.

5. The method of claim 1 wherein the step of determining the current temperature of the component includes reading a temperature signal from the component.

6. The method of claim 1 wherein the general characteristic maximum cooling temperature corresponds to a temperature that requires a maximum operating level of the cooling apparatus for components of the component type.

7. The method of claim 1 additionally comprising retrieving a component temperature offset value for the component.

8. The method of claim 7 wherein the step of retrieving the component temperature offset value comprises reading the component temperature offset value from a storage location on the specific component of the information handling system.

9. The method of claim 7 wherein the step of retrieving the component temperature offset value comprises reading the component temperature offset value from a storage location on the information handling system.

10. The method of claim 7 wherein the step of combining includes combining the current temperature and the system temperature offset value with the component temperature offset value for the component into the combined value.

11. The method of claim 1 wherein the system temperature offset value is retrieved from a storage location on the information handling system.

12. The method of claim 1 wherein the system temperature offset value is based upon cooling characteristics of the components of the information handling system.

13. The method of claim 1 wherein the system temperature offset value is based upon impediments to air flow in the case of the information handling system.

14. The method of claim 1 wherein the system temperature offset value is based upon a position of the component in the case of the information handling system.

15. A method of operating a cooling apparatus for an information handling system, comprising:
   determining by the cooling apparatus a current temperature of a component of the information handling system;
   obtaining by the cooling apparatus a general characteristic maximum cooling temperature for the component type of the component of the information handling system;
   retrieving by the cooling apparatus a system temperature offset value for the information handling system;
   retrieving a component temperature offset value for the component;
   combining the current temperature of the component and the system temperature offset value for the information handling system into a combined value;
   comparing the combined value with a maximum cooling threshold value; and
   initiating a level of operation of the coolin apparatus of the information handling system based upon the comparison of the combined value with the maximum cooling threshold value;
   wherein the component temperature offset value corresponds to an offset between the general characteristic maximum cooling temperature for the component type and a specific characteristic maximum cooling temperature for the specific component of the information handling system; and
   wherein the system temperature offset value is based upon an arrangement of components of the information handling system in a case of the information handling system.

16. A method of operating a cooling apparatus for an information handling system, comprising:
   determining by the cooling apparatus a current temperature of a component of the information handling system;
   obtaining by the cooling apparatus a general characteristic maximum cooling temperature for the component type of the component of the information handling system;
   retrieving by the cooling apparatus a system temperature offset value for the information handling system;
   retrieving a component temperature offset value for the component;
   combining the current temperature of the component and the system temperature offset value for the information handling system into a combined value;
   comparing the combined value with a maximum cooling threshold value; and
   initiating a level of operation of the cooling apparatus of the information handling system based upon the comparison of the combined value with the maximum cooling threshold value;
   wherein the system temperature offset value corresponds to an offset between the general characteristic maximum cooling temperature value for the component type, adjusted by the specific component temperature offset value for the specific component, and a predetermined temperature of the component that requires a maximum level of cooling apparatus operation when the component is installed in the information handling system; and wherein the system temperature offset value is based upon an arrangement of components of the information handling system in a case of the information handling system.

17. A method of operating a cooling apparatus for an information handling system, comprising:

determining by the cooling apparatus a current temperature of a component of the information handling system;

obtaining by the cooling apparatus a general characteristic maximum cooling temperature for the component type of the component of the information handling system;

retrieving by the cooling apparatus a system temperature offset value for the information handling system;

combining the current temperature of the component and the system temperature offset value for the information handling system into a combined value;

comparing the combined value with a maximum cooling threshold value; and initiating level of operation of the cooling apparatus of the information handling system based upon the comparison of the combined value with the maximum cooling threshold value:

wherein the system temperature offset value corresponds to an offset between the general characteristic maximum cooling temperature value for the component type and a predetermined temperature of the component that requires a maximum level of cooling apparatus operation when the component is installed in the information handling system; and wherein the system temperature offset value is based upon an arrangement of components of the information handling system in a case of the information handling system.

18. An information handling system, comprising:

a cooling apparatus having a maximum level of operation and a level of operation less than the maximum level of operation;

a component;

means for determining a current temperature of a component of the information handling system;

means for obtaining a general characteristic maximum cooling temperature for a component type of the component;

means for retrieving a system temperature offset value for the information handling system;

means for combining the current temperature of the component and the system temperature offset value for the information handling system into a combined value;

means for comparing the combined value with a maximum cooling threshold value;

wherein the system temperature offset value is based upon cooling characteristics of the information handling system including the cooling system and the component; and wherein the system temperature offset value is based upon an arrangement of components of the information handling system in a case of the information handling system.

19. The system of claim 18 additionally comprising means for initiating the maximum level of operation for the cooling apparatus if the combined value is equal to or greater than the maximum cooling threshold value.

20. The system of claim 18 additionally comprising means for operating the cooling apparatus of the information handling system at a level less than the maximum level of operation of the cooling apparatus if the combined value is less than the maximum cooling threshold value.

21. The system of claim 18 additionally comprising means for retrieving a component temperature offset value for the component.

22. The system of claim 21 wherein the means for combining includes means for combining the current temperature and the system temperature offset value with the component temperature offset value for the component into the combined value.

* * * * *